United States Patent
Jang (10) Patent No.: US 9,654,100 B2
(45) Date of Patent: May 16, 2017

(54) OUTPUT BUFFER, AND SOURCE DRIVER AND DISPLAY DEVICE INCLUDING THE SAME

(71) Applicant: Dae Joong Jang, Anyang-si (KR)

(72) Inventor: Dae Joong Jang, Anyang-si (KR)

(73) Assignee: Dongbu HiTek Co., Ltd., Bucheon-si (KR)

(*) Notice: Subject to any disclaimer, the term of this patent is extended or adjusted under 35 U.S.C. 154(b) by 43 days.

(21) Appl. No.: 14/734,385

(22) Filed: Jun. 9, 2015

(65) Prior Publication Data

US 2016/0087627 A1   Mar. 24, 2016

(30) Foreign Application Priority Data

Sep. 22, 2014 (KR) .................. 10-2014-0125967

(51) Int. Cl.
| | | |
|---|---|---|
| *G06F 3/038* | (2013.01) | |
| *G09G 5/00* | (2006.01) | |
| *H03B 1/00* | (2006.01) | |
| *H03K 3/00* | (2006.01) | |
| *H03K 17/687* | (2006.01) | |
| *G09G 5/18* | (2006.01) | |

(52) U.S. Cl.
CPC ........... *H03K 17/6871* (2013.01); *G09G 5/18* (2013.01); *G09G 2310/0289* (2013.01)

(58) Field of Classification Search
CPC ....... H03K 17/6871; G09G 2310/0289; G09G 5/18
See application file for complete search history.

(56) References Cited

U.S. PATENT DOCUMENTS

| | | | |
|---|---|---|---|
| 2008/0218244 A1* | 9/2008 | Oishi ................ | H03F 3/45475 327/389 |
| 2012/0127138 A1* | 5/2012 | Tsuchi ................ | H03F 1/0261 345/204 |

* cited by examiner

*Primary Examiner* — Charles Hicks
(74) *Attorney, Agent, or Firm* — Andrew D. Fortney; Central California IP Group, P.C.

(57) ABSTRACT

Disclosed is an output buffer. The output buffer includes a first amplifier configured to amplify an input signal, and output first to fourth amplified signals according to results of the amplification, a first transistor to receive the first amplified signal, a second transistor to receive the second amplified signal, a third transistor to receive the third amplified signal, a fourth transistor to receive the fourth amplified signal, a first node, connected to drains of the first and second transistors, a second node, connected to drains of the third and fourth transistors, an output node connected to the first and second nodes, and a first controller configured to selectively supply a control voltage to the gates of the first to fourth transistors in response to a control signal.

19 Claims, 8 Drawing Sheets

|  | case 1 | case 2 |
|---|---|---|
| TOTAL | 0.856 [w] | 0.899 [w] |
| AMP | 0.815 [w] | 0.733 [w] |
| SW | 0 [w] | 0.120 [w] |
| TEMPERATURE | 120°C | 125°C |

OUTPUT BUFFER, AND SOURCE DRIVER AND DISPLAY DEVICE INCLUDING THE SAME

This application claims the benefit of Korean Patent Application No. 10-2014-0125967, filed on Sep. 22, 2014 which is hereby incorporated by reference as if fully set forth herein.

BACKGROUND OF THE INVENTION

Field of the Invention

Embodiments of the present invention relate to an output buffer, a source driver and a display device including the same, and a method of using the same.

Discussion of the Related Art

A source driver may include latches for driving source lines of a liquid crystal panel and storing data, a level shifter for shifting a voltage level of the stored data, a digital-to-analog converter for converting the voltage-level-shifted data into an analog signal, and an output buffer for amplifying the analog signal. The source driver may output the amplified signal to the source lines.

When a voltage is applied to a liquid crystal of a pixel only in one direction upon driving the liquid crystal panel, degradation of the liquid crystals may be accelerated. To this end, an inversion method, in which an image data voltage applied to the liquid crystals is periodically inverted to periodically have an opposite polarity, is used.

Such an inversion method includes frame inversion, line inversion, and dot inversion. Frame inversion is a method in which voltage polarities of all pixels in the liquid crystal panel are inverted at the same time. Line inversion is a method in which lines connected to adjacent scan lines are alternately inverted. Dot inversion is a method in which inversion is performed on a pixel-by-pixel basis.

Output buffers of a source driver may alternately output signals having opposite polarities every period according to a given inversion method. Signals to control such operation of the output buffers may be referred to as inversion polarity signals (POL). In order to output signals having opposite polarities, each output buffer of the source driver may include a multiplexer including switches that perform a switching operation in response to the inversion polarity signals.

Each output buffer should supply a large current to the switches of the multiplexer thereof in order for the output voltage to reach a predetermined level within a line time determined and/or based on resolution of the liquid crystal panel. However, when a large current is supplied to the switches, a large amount of heat may be generated due to the resistance of the switches. For this reason, when the output voltage of the output buffer changes, the slew rate of the output buffer may decrease.

SUMMARY OF THE INVENTION

Embodiments of the present invention provide an output buffer capable of reducing delay in an output signal and heat generation, and a source driver and a display device including the same.

Additional advantages, objects, and features of various embodiments will be set forth in part in the description which follows and in part will become apparent to those having ordinary skill in the art upon examination of the following or may be learned from practice of the embodiments. The objectives and other advantages of the embodiments may be realized and attained by the structure particularly pointed out in the written description and claims hereof as well as the appended drawings.

To achieve these objects and other advantages and in accordance with the purpose of the embodiments, as embodied and broadly described herein, an output buffer includes a first amplifier configured to amplify an input signal and output first to fourth amplified signals (e.g., according to results of the amplification), a first transistor comprising a first drain, a first gate configured to receive the first amplified signal, and a first source, a second transistor comprising a second drain connected to the first drain at a first node, a second gate configured to receive the second amplified signal, and a second source, a third transistor comprising a third drain, a third gate configured to receive the third amplified signal, and a third source connected to the second source, a fourth transistor comprising a fourth drain connected to the third drain at a second node, a fourth gate configured to receive the fourth amplified signal, and a fourth source, an output node connected to the first and second nodes, and a first controller configured to selectively supply a control voltage to the first to fourth gates in response to a control signal.

A first supply voltage may be supplied to the fourth source. A second supply voltage higher than the first supply voltage may be supplied to the second source and the third source. A third supply voltage higher than the second supply voltage may be supplied to the first source.

The first and third transistors may have a first conduction type. The second and fourth transistors may have a second conduction type. The first conduction type and the second conduction type may be opposite.

The first controller may disconnect the control voltage from the third and fourth gates when the control voltage is supplied to the first and second gates, and vice versa (i.e., the first controller may disconnect the control voltage from the first and second gates when the control voltage is supplied to the third and fourth gates).

The control voltage may include a first supply voltage and a third supply voltage higher than the first supply voltage. The first controller may supply one of the first and third supply voltages to one of the first and second gates or one of the third and fourth gates, and may supply the other of the first and third supply voltages to the other of the first and second gates and the other of the third and fourth gates.

The output buffer may further include a switching unit configured to supply the amplified signals to or disconnect the amplified signals from the first to fourth gates in response to the control signal.

The first amplifier may supply the amplified signals to or disconnect the amplified signals from the first to fourth gates in response to the control signal.

The output buffer may further include a second controller configured to supply a first leakage cut-off control voltage to a body or bulk of the second transistor and supply a second leakage cut-off control voltage to a body or bulk of the third transistor. In some embodiments, the first leakage cut-off control voltage is supplied to the body or bulk of the second transistor, or the second leakage cut-off control voltage is supplied to the body or bulk of the third transistor, in response to the control signal.

In some embodiments, the first leakage cut-off control voltage may be higher than the third supply voltage, and the second leakage cut-off control voltage may be lower than the first supply voltage.

In other embodiments, the first leakage cut-off control voltage may be one of the first and second supply voltages, and the second leakage cut-off control voltage may be one of the second and third supply voltages.

Alternatively, the first leakage cut-off control voltage may be lower than the first supply voltage and may be supplied to the body or bulk of the second transistor (e.g., directly, or without the second controller), and the second leakage cut-off control voltage may be higher than the third supply voltage and may be supplied (e.g., directly, or without the second controller) to the body or bulk of the third transistor.

The first amplifier may comprise a rail-to-rail amplifier.

In another aspect, a source driver includes a latch unit configured to store data, a level shifter configured to shift a voltage level of the data from the latch unit, a digital-to-analog converter configured to convert an output from the level shifter into an analog signal, and an output buffer configured to amplify the analog signal and output the amplified signal. The output buffer may be the output buffer according to any of the embodiments described herein.

In another aspect, a display device includes a display panel comprising gate lines in rows and source lines in intersecting columns to form a matrix, and pixels each connected to one of the gate lines and one of the source lines at an intersection thereof, a plurality of source drivers configured to drive the source lines, and a timing controller configured to supply a control signal to each of the source drivers. Each of the source drivers may be the source driver according to any embodiment described herein.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Hereinafter, various embodiments will be described in detail with reference to the annexed drawings for better understanding. In the following description, it will be understood that, when an element such as a layer (film), region, pattern, or structure is referred to as being "on" or "under" another element, it can be directly on or under the other element, or indirectly on or under the other element, such that an intervening element is also present. In addition, terms such as "on" or "under" should be understood on the basis of the drawings.

In the drawings, dimensions of layers are exaggerated, omitted or schematically illustrated for clarity and convenience of description. In addition, dimensions of constituent elements do not entirely reflect actual dimensions thereof. The same reference numerals denote the same constituent elements.

Figure 1:
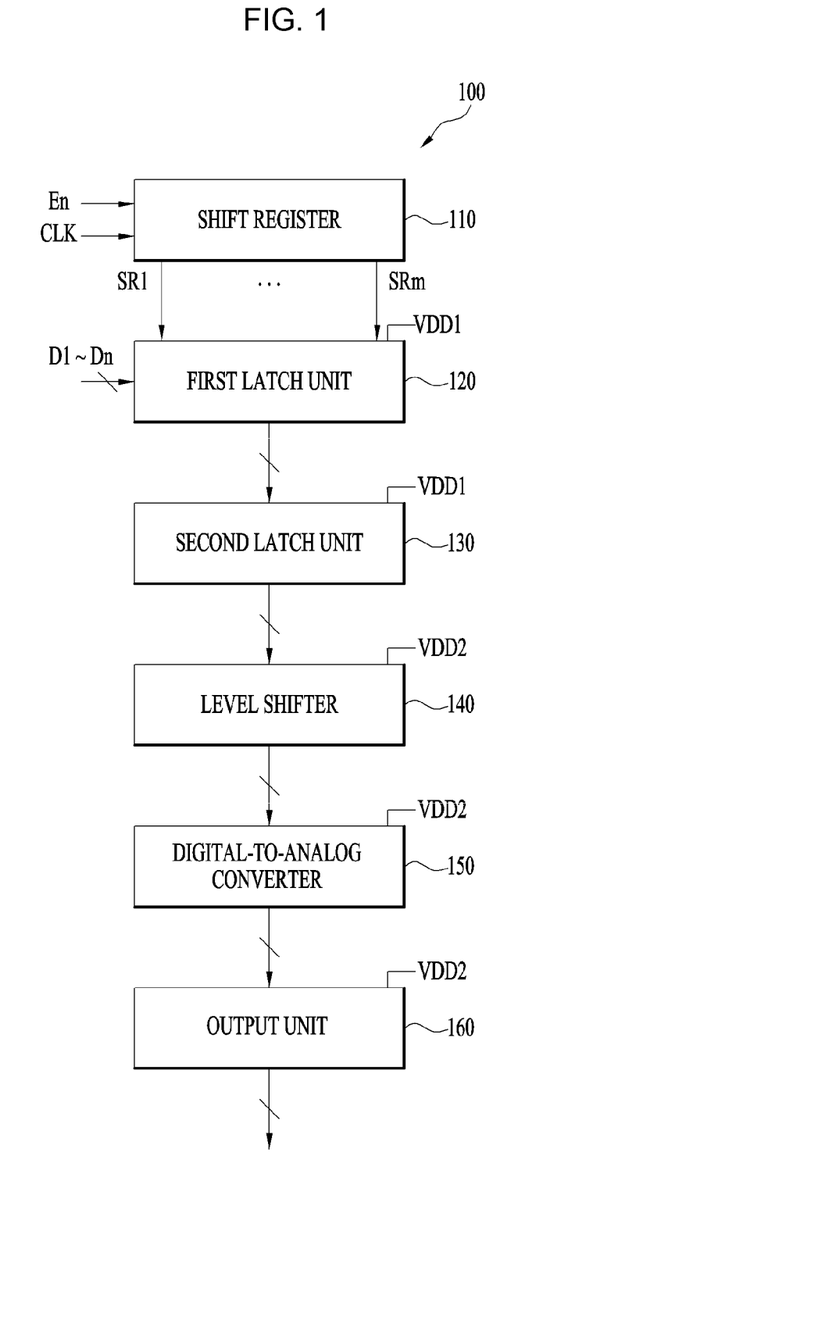
FIG. 1 is a block diagram briefly illustrating an exemplary source driver according to one or more embodiments of the invention.

FIG. 1 is a block diagram briefly illustrating a source driver 100 according to one or more embodiments of the invention.

Referring to FIG. 1, the source driver 100 includes a shift register 110, a first latch unit 120, a second latch unit, a level shifter unit 140, a digital-to-analog converter 150, and an output unit 160.

The shift register 110 generates shift signals SR1 to SRm (m being a natural number greater than 1) in response to an enable signal En and a clock signal CLK, that control the timing of storage of data (for example, digital image data) that is sequentially stored in the first latch unit 120.

For example, the shift register 110 may receive a horizontal start signal from a timing controller 205 (FIG. 11), and may shift the received horizontal start signal in response to the clock signal CLK. As such, the shift register 110 may generate the shift signals SR1 to SRm (m being a natural number greater than 1). The horizontal start signal may be used together with a start pulse.

The first latch unit 120 stores data D1 to Dn (n being a natural number greater than 1) received from the timing controller 205 (FIG. 11) in response to shift signals SR1 to SRm (m being a natural number greater than 1) generated from the shift register 110, respectively.

The first latch unit 120 may include a plurality of first latches (not shown). The first latches may store data D1 to Dn (n being a natural number greater than 1), respectively.

For example, the data received from the timing controller 205 may be red (R), green (G), and blue (B) pixel data. The first latches of the first latch unit 120 may store various data (e.g., luminance, chroma or chrominance, etc.) from R, G, and B pixels.

That is, the data D1 to Dn (n being a natural number greater than 1) received from the timing controller 205 may be sequentially stored in the first latches included in the first latch unit 120 in response to the shift signals SR1 to SRm (m being a natural number greater than 1).

The second latch unit 130 stores data output from the first latch unit 120 in response to a control signal from the timing controller 205.

For example, the second latch unit 130 may store the data from the first latch unit 120 on a horizontal line period basis.

For example, one horizontal line period may be a period taken to completely store data corresponding to one horizontal line 204 (FIG. 11) of a display panel 201 (FIG. 11) in the first latches of the first latch unit 130.

For example, one horizontal line period may be a period between a first time and a second time.

The first time may be a time when data is output in the form of a first analog signal by the digital-to-analog converter 150 (via the level shifter unit 140, after being transferred to the second latch 130 from the first latch unit 120 in response to a horizontal line signal). The second time may be a time when data is output in the form of a second analog signal by the digital-to-analog converter 150 (via the level shifter unit 140, after being transferred to the second latch 130 from the first latch unit 120 in response to a next horizontal line signal).

Alternatively, for example, one horizontal line period may mean one period of horizontal line signals.

The second latch unit 130 may include a plurality of second latches. The number of the second latches may be equal to the number of the first latches.

The level shifter unit 140 shifts a voltage level of the data from the second latch unit 130. For example, the level shifter unit 140 may shift the voltage level of the data from a first voltage level to a second voltage level.

For example, the drive voltage of the level shifter unit 140 (namely, a drive voltage VDD2) may be higher than a drive voltage VDD1 of the first latch unit 120 and the second latch unit 130.

The level shifter unit 140 may include a plurality of level shifters. The number of the level shifters may be equal to the number of the first latches and/or the number of the second latches. Of course, embodiments are not limited to such conditions.

The digital-to-analog converter 150 converts an output from the level shifter unit 140 (namely, digital data having the second voltage level) into an analog signal.

For example, the digital-to-analog converter 150 receives grayscale voltages generated by a power supply (not shown), and converts an output from the level shifter unit 140 into an analog signal using the grayscale voltages.

For example, the power supply (not shown) may be implemented with a plurality of resistors connected in series between a supply voltage source VDD2 and a ground voltage source GND. As such, the power supply may generate multi-level grayscale voltages (for example, 256-level grayscale voltages).

The output unit 160 amplifies (or buffers) the analog signal output from the digital-to-analog converter 150, and outputs the amplified (or buffered) analog signal.

The output unit 160 may include a plurality of amplifiers or a plurality of buffers.

Figure 2:
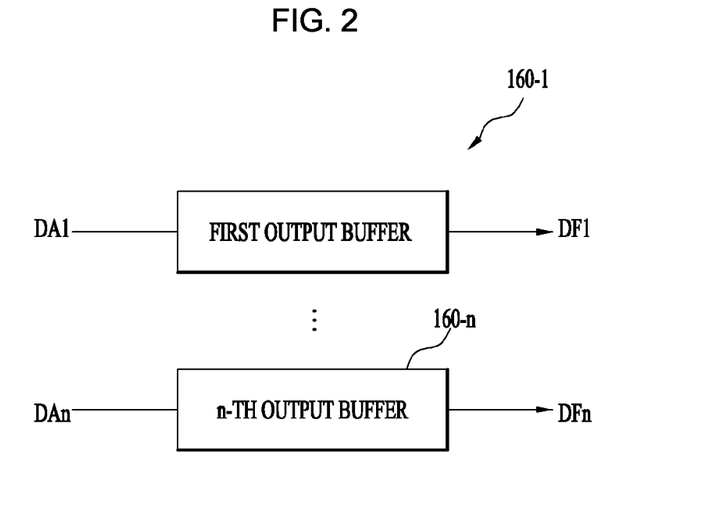
FIG. 2 is a block diagram illustrating one or more embodiments of the output unit illustrated in FIG. 1.

FIG. 2 illustrates one or more embodiments of the output unit 160 illustrated in FIG. 1.

Referring to FIG. 2, the output unit 160 may include a plurality of output buffers 160-1 to 160-n (n being a natural number greater than 1).

Each of the first to n-th output buffers 160-1 to 160-n (n being a natural number greater than 1) may amplify or buffer an analog signal DA1 . . . or DAn (n being a natural number greater than 1) from a corresponding one of the digital-to-analog converters.

Figure 3:
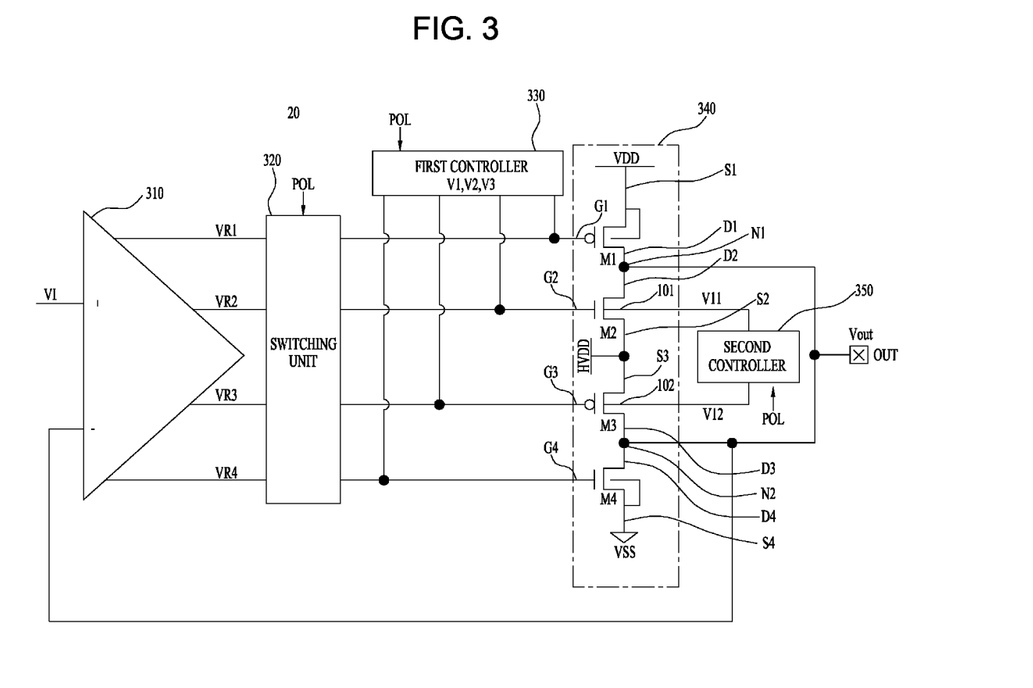
FIG. 3 is a circuit diagram illustrating one or more embodiments of the first output buffer illustrated in FIG. 2.

FIG. 3 illustrates one or more embodiments of the first output buffer 160-1 illustrated in FIG. 2. The configurations of the remaining output buffers 160-2 to 160-n may be identical to the configuration of the first output buffer 160-1 illustrated in FIG. 3.

Referring to FIG. 3, the output buffer 160-1 may include a first amplifier 310, a switching unit 320, a first controller 330, a second amplifier 340, and a second controller 350.

The first amplifier 310 may amplify an input signal VI and output first to fourth amplified signals VR1 to VR4. The first to fourth amplified signals VR1 to VR4 may have different waveforms (e.g., in accordance with the results of amplification by the first amplifier 310).

For example, the first amplifier 310 may comprise a rail-to-rail amplifier. An output signal Vout from an output node OUT of the output buffer 160-1 may be fed back as an input to the first amplifier 310.

For example, the first amplifier 310 may include a first input terminal (+), configured to receive the input signal VI, a second input terminal (−), configured to receive the output signal Vout from the output node OUT, and output terminals to output the first to fourth amplified signals VR1 to VR4.

The first amplified signal VR1 may have a signal swing (e.g., a value) between a first supply voltage VSS and a second supply voltage HVDD.

The second amplified signal VR2 may be a signal inverted from or complementary to the first amplified signal VR1 (e.g., having a value of HVDD minus the value or complementary to of the first amplified signal VR1).

The third amplified signal may have a signal swing (e.g., a value) between the second supply voltage HVDD and a third supply voltage VDD.

The fourth amplified signal may be a signal inverted from or complementary to the third amplified signal VR3 (e.g., having a value of VDD minus the values of the first amplified signal VR1).

The switching unit 320 supplies some of the amplified signals VR1 to VR4 from the first amplifier 310 as an input to the second amplifier 340 and disconnects some of the amplified signals VR1 to VR4 from the second amplifier 340 in response to a control signal POL.

The switching unit 320 may supply some of the amplified signals VR1 to VR4 to first to fourth gates G1 to G4, respectively, and may cut off supply of some of the amplified signals VR1 to VR4 to first to fourth gates G1 to G4 in response to the control signal POL.

For example, the switching unit 320 may be between an output stage of the first amplifier 310 and an input stage of the second amplifier 340. In response to the control signal POL, the switching unit 320 may electrically connect or disconnect signal paths from the output stage of the first amplifier 310 to the input stage of the second amplifier 340. Here, the control signal POL may be a polarity signal, which in some embodiments is configured for inversion (e.g., half of the signal paths are controlled by the true value of the control signal POL, and half of the signal paths are controlled by the complementary or inverse value of the control signal POL).

The second amplifier 340 amplifies the first to fourth amplified signals VR1 to VR4, and outputs an analog data signal (e.g., according to results of the amplification by the second amplifier 340).

The second amplifier 340 may include first to fourth transistors M1 to M4. The first and third transistors M1 and M3 may have a first conductivity type, whereas the second and fourth transistors M2 and M4 may have a second conductivity type. The first conductivity type and the second conductivity type may be complementary or opposite.

The first transistor M1 may include a first drain D1, a first gate G1, and a first source S1 connected to the third supply voltage VDD.

The second transistor M2 may include a second drain D2 connected to the first drain D1, a second gate G2, and a second source S2.

The node N1 at which the first and second drains D1 and D2 are connected may be connected to an output node OUT.

The third transistor M3 may include a third drain D3, a third gate G3, and a third source S3 connected to the second source S2. The second and third sources S2 and S3 may be connected in common to the second supply voltage HVVD.

The fourth transistor M4 may include a fourth drain D4 connected to the third drain D3, a fourth gate G4, and a fourth source S4 connected to the first supply voltage VSS.

The node N2 at which the third and fourth drains D3 and D4 are connected may be connected to the output node OUT.

For example, the first supply voltage VSS may be a ground voltage, the second supply voltage HVDD is higher than the first supply voltage VSS, and the third supply voltage VDD is higher than the second supply voltage HVDD (VSS<HVDD<VDD).

Each of the first to fourth amplified signals VR1 to VR4 may be supplied to a corresponding one of the first to fourth gates G1 to G4.

For example, the first and third transistors M1 and M3 may be PMOS transistors (i.e., the first conductivity type is p-type), whereas the second and fourth transistors M2 and M4 may be NMOS transistors (i.e., second conductivity type is n-type).

The first controller 330 may selectively supply control voltages V1, V2, and V3 to the first to fourth gates G1 to G4 of the first to fourth transistors M1 to M4 in response to the control signal POL.

Upon supplying control voltages to the first and second gates G1 to G2, the first controller 330 may disconnect control voltages to the third and fourth gates G3 and G4. On the other hand, the first controller 330 may disconnect control voltages to the first and second gates G1 and G2 upon supplying control voltages to the third and fourth gates G3 and G4.

The first controller 330 may supply one of the first and third supply voltages VSS and VDD to one of the first and second gates G1 and G2 or to one of the third and fourth gates G3 and G4 while supplying the other of the first and third supply voltages VSS and VDD to the other of the first and second gates G1 and G2 or to the other of the third and fourth gates G3 and G4.

For example, when the control signal POL has a first level (for example, a high logic level), the first controller 330 may supply a third control voltage V3 to the third gate G3 of the third transistor M3 and a first control voltage V1 to the fourth gate G4 of the fourth transistor M4, in order to turn off the third and fourth transistors M3 and M4.

In one embodiment, the third control voltage V3 may be a high-level voltage, and the first control voltage V1 may be a low-level voltage in order to turn off the PMOS transistor M3 and NMOS transistor M4.

When the control signal POL has the first level (for example, the high logic level), the third and fourth transistors M3 and M4 may be turned off by the control voltages V3 and V1 to the third and fourth gates G3 and G4, irrespective of the third and fourth amplified signals VR3 and VR4. Accordingly, the output signal from the second node N2 does not affect or influence the output node OUT. In this case, the signal from the first node N1 may become the output signal Vout.

In this case, the first and second transistors M1 and M2 may be turned on or off, based on the first and second amplified signals VR1 and VR2. For example, one of the first and second transistors M1 and M2 may be turned on, and the other of the first and second transistors M1 and M2 may be turned off, based on the first and second amplified signals VR1 and VR2. In this case, the output signal Vout may swing (e.g., have a value) between the third supply voltage VDD and the second supply voltage HVDD.

On the other hand, when the control signal POL has a second level (for example, a low logic level), the first controller 330 may supply the third control voltage V3 to the first gate G1 of the first transistor M1 and the first control voltage V1 to the second gate G2 of the second transistor M2, in order to turn off the first and second transistors M1 and M2.

When the control signal POL has the second level, the first and second transistors M1 and M2 may be turned off by the control voltages V3 and V1 to the first and second gates G1 and G2, irrespective of the first and second amplified signals VR1 and VR2. Accordingly, the output signal from the first node N1 does not affect or influence the output node OUT. In this case, the signal from the second node N2 may become the output signal Vout.

In this case, the third and fourth transistors M3 and M4 may be turned on or off, based on the third and fourth amplified signals VR3 and VR4. For example, one of the third and fourth transistors M3 and M4 may be turned on, and the other of the third and fourth transistors M3 and M4 may be turned off, based on the third and fourth amplified signals VR3 and VR4. In this case, the output signal Vout may swing (e.g., have a value) between the first supply voltage VSS and the second supply voltage HVDD.

The first controller 330 may function as a selector configured to select from among the first to fourth transistors M1 to M4 to output the signal Vout.

Since the body or bulk voltage of the transistors M2 and M3 is the second supply voltage HVDD, when either of the transistors M2 and M3 is turned off by the first controller 330, a great leakage current may flow through a parasitic diode formed between the output node OUT and the drains of the transistors turned off by the first controller 330.

Figure 4A:
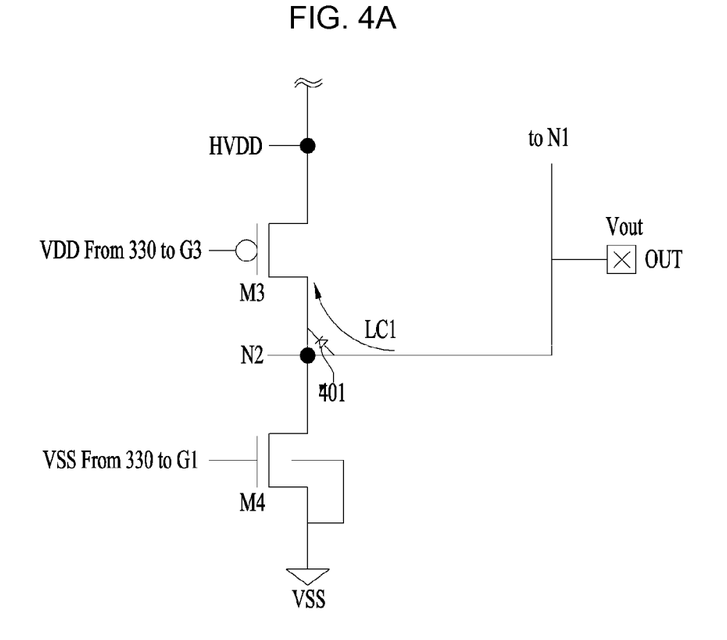
FIG. 4A is a circuit diagram illustrating leakage current through a parasitic diode formed at an output node between third and fourth transistors.

FIG. 4A illustrates a first leakage current LC1 flowing through a parasitic diode 401 formed between the drains of the third and fourth transistors M3 and M4 and the output node OUT when the third and fourth transistors M3 and M4 are turned off by the first controller 330.

Hereinafter, the leakage current LC1 flowing through the third transistor M3 when the control signal POL has the first level (for example, a high logic level) and the third and fourth transistors M3 and M4 are turned off by the first controller 330 will be described with reference to FIG. 4A. For example, the first supply voltage VSS may be 0V, the second supply voltage HVDD may be 9V, and the third supply voltage VDD may be 18V.

When the first transistor M1 is turned on and the second transistor M2 is turned off, based on the first and second amplified signals VR1 and VR2, respectively, the output from the first node N1 (namely, the output Vout) may rise to the third supply voltage VDD (VDD=18V).

Since the output signal Vout may become the third supply voltage VDD (VDD=18V), and the body or bulk voltage of the third transistor M3 may become the second supply voltage HVDD (HVDD=9V), a forward bias voltage may be applied across the parasitic diode 401 between the output node OUT and the body or bulk of the third transistor M3.

Then, a leakage current LC1 may flow from the output node OUT to the third transistor M3 due to the forward bias voltage. Due to the leakage current LC1, the voltage Vout at the output node OUT may fall to a value of the sum of the second supply voltage HVVD and the threshold voltage (about 0.7V) of the parasitic diode 401 (Vout=HVDD (9V)+ 0.7V).

Figure 4B:
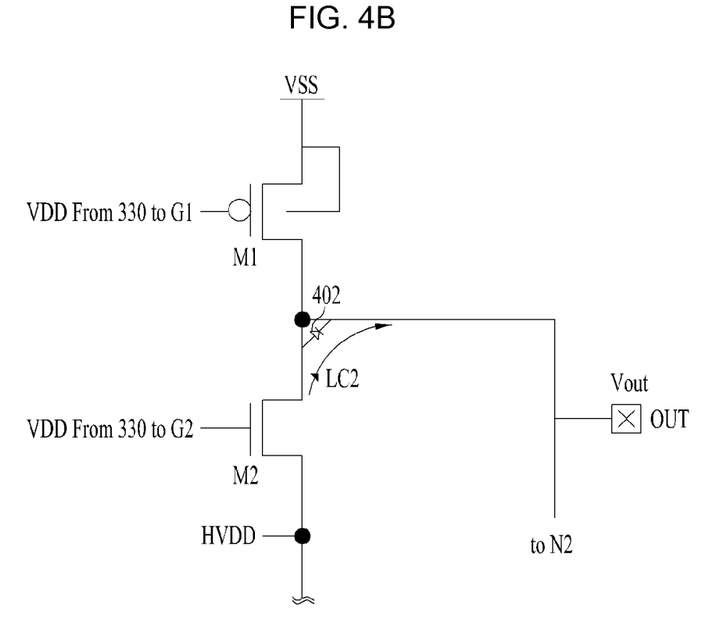
FIG. 4B is a circuit diagram illustrating leakage current through a parasitic diode formed at an output node between first and second transistors.

FIG. 4B illustrates a second leakage current LC2 flowing through a parasitic diode 402 formed between the drains of the first and second transistors M1 and M2 and the output node OUT when the first and second transistors M1 and M2 are turned off by the first controller 330.

Hereinafter, the leakage current LC2 flowing through the first transistor M1 when the control signal POL has the second level (for example, a low logic level) and the first and second transistors M1 and M2 are turned off by the first controller 330 will be described with reference to FIG. 4B.

When the third transistor M3 is turned off, and the fourth transistor M4 is turned on, based on the third and fourth amplified signals VR3 and VR4, respectively, the output from the second node N2 (namely, the output Vout) may fall to the first supply voltage VSS (VSS=0V).

Since the output signal Vout may become the third supply voltage VDD (VDD=18V), and the body or bulk voltage of the second transistor M2 may become the second supply voltage HVDD (HVDD=9V), a forward bias voltage may be applied across the parasitic diode 402 between the body or bulk of the second transistor M2 and the output node OUT.

Then, a leakage current LC2 may flow from the second transistor M2 to the output node OUT due to the forward bias voltage. Due to the leakage current LC2, the voltage Vout at the output node OUT may rise to a value of the difference between the second supply voltage HVDD (9V) and the threshold voltage (about 0.7V) of the parasitic diode 402 (Vout=HVDD (9V)−0.7V).

The second controller 350 may supply leakage cut-off control signals V11 and V12 to the body or bulk 101 of the second transistor M2 and the body or bulk 102 of the third transistor M3 and, as such, may reduce or prevent leakage current from flowing between the output node OUT and the second and third transistors M2 and M3. It may also be possible to reduce or prevent variation of the output voltage Vout caused by leakage current.

Now, operation of the second controller 350 in the case of FIG. 4A will be described.

The second controller 350 may supply the first leakage cut-off control voltage V11 to the body or bulk 102 of the third transistor M3. The first leakage cut-off control voltage V11 may be higher than the third supply voltage VDD. For example, the first leakage cut-off voltage V11 may be higher than or equal to the third supply voltage VDD minus the threshold voltage (about 0.7V) of the parasitic diode 401 (V11≥VDD−about 0.7V).

Since reverse bias is applied to the parasitic diode 401 due to the first leakage cut-off control voltage V11, generation of leakage current may be prevented.

Next, operation of the second controller 350 in the case of FIG. 4B will be described.

The second controller 350 may supply the second leakage cut-off control voltage V12 to the body or bulk 102 of the second transistor M2. The second leakage cut-off control voltage V12 may be lower than the second supply voltage HVDD. For example, the second leakage cut-off voltage V12 may be lower than or equal to the sum of the threshold voltage (about 0.7V) of the parasitic diode 401 and the second supply voltage HVDD (V12≤HVDD+about 0.7V).

Figure 5:
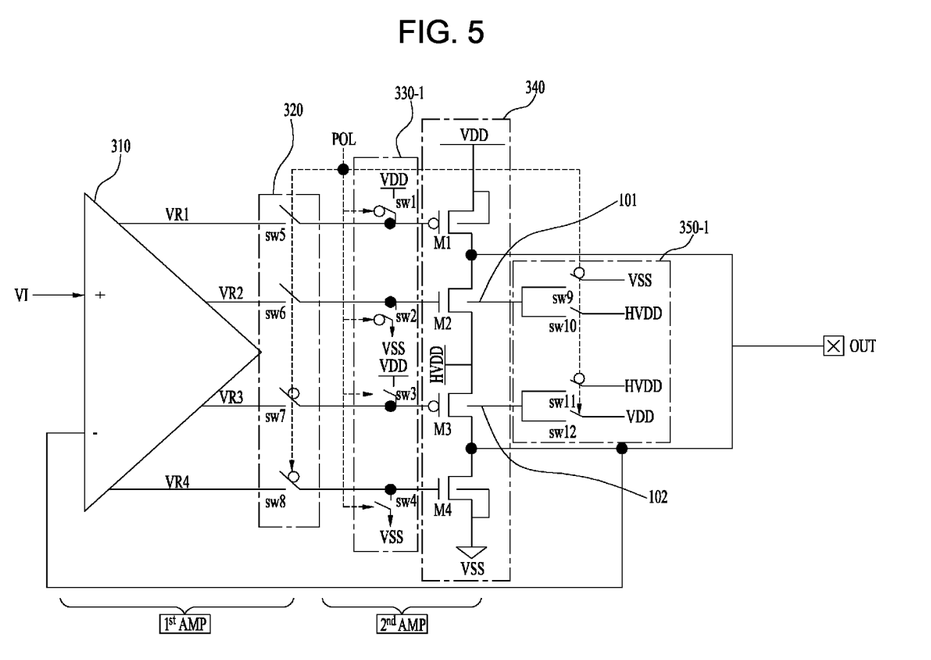
FIG. 5 is a circuit diagram illustrating an embodiment of the output buffer illustrated in FIG. 3.

FIG. 5 illustrates an embodiment of the output buffer in FIG. 3. In FIG. 5, constituent elements identical to those of FIG. 3 will be designated by the same reference numerals, and description thereof will be briefly given or will be eliminated.

Referring to FIG. 5, the switching unit 320 may include a plurality of switches sw5 to sw8 between the output terminals of the first amplifier 310 and the first to fourth gates of the first to fourth transistors M1 to M4.

For example, each of the switches sw5 to sw8 may be between a corresponding one of the output terminals of the first amplifier 310 and a corresponding one of the first to fourth gates of the first to fourth transistors M1 to M4, and may connect or disconnect the output terminals VR1-VR4 of the first amplifier 310 to or from the respective gates of the first to fourth transistors M1 to M4 in response to a control signal POL.

The switches sw5 and sw6 respond to the control signal POL in a manner complementary to the switches sw7 and sw8. For example, when the switches sw5 and sw6 are turned on in response to the control signal POL, the switches sw7 and sw8 may be turned off. On the other hand, when the switches sw7 and sw8 are turned on, the switches sw5 and sw6 may be turned off.

In one embodiment, when the control signal POL has the first level (e.g., a high logic level), the switches sw5 and sw6 may be turned on, and the switches sw7 and sw8 may be turned off. As a result, the first and second amplified signals VR1 and VR2 may be supplied to the first and second gates of the first and second transistors M1 and M2, whereas the third and fourth amplified signals VR3 and VR4 may be disconnected from the gates of the third and fourth transistors M3 and M4.

On the other hand, for example, when the control signal POL has the second level (e.g., a low logic level), the switches sw7 and sw8 may be turned on, and the switches sw5 and sw6 may be turned off. As a result, the third and fourth amplified signals VR3 and VR4 may be supplied to the third and fourth gates of the third and fourth transistors M3 and M4, whereas the first and second amplified signals VR1 and VR2 may be disconnected from the gates of the first and second transistors M1 and M2.

Thus, the switching unit 320 may selectively connect some of the transistors of the second amplifier 340 to corresponding output terminals of the first amplifier 310 and selectively disconnect the remaining transistors of the second amplifier 340 from corresponding output terminals of the first amplifier 310. As such, it may be possible to reduce unnecessary power consumption.

The first controller, which is designated by reference numeral "330-1", may include a plurality of switches sw1 to sw4 configured to connect or disconnect the gates of the first to fourth transistors M1 to M4 to the first supply voltage VSS or third supply voltage VDD.

For example, when the switches sw1 and sw2 are turned on in response to the control signal POL, the switches sw3 and sw4 may be turned off. On the other hand, when the switches sw3 and sw4 are turned on, the switches sw1 and sw2 may be turned off.

The first switch sw1 may supply the third supply voltage VDD to the gate of the first transistor M1 or disconnect the third supply voltage VDD from the gate of the first transistor M1, based on the state of the control signal POL.

For example, the first switch sw1 may be connected between the third supply voltage VDD and the gate of the first transistor M1, and may be turned on or off in response to the control signal POL.

The second switch sw2 may supply the first supply voltage VSS to the gate of the second transistor M2 or disconnect the first supply voltage VSS from the gate of the second transistor M2, based on the state of the control signal POL.

For example, the second switch sw2 may be connected between the first supply voltage VSS and the gate of the second transistor M2, and may be turned on or off in response to the control signal POL.

When one of the first and second switches sw1 and sw2 is turned on in response to the control signal POL, the other of the first and second switches sw1 and sw2 may be turned off. For example, the first and second switches sw1 and sw2 may be implemented with transistors of different conduction types.

The third switch sw3 may supply the third supply voltage VDD to the gate of the third transistor M3 or disconnect the third supply voltage VDD from the gate of the third transistor M3, based on the state of the control signal POL.

For example, the third switch sw3 may be connected between the third supply voltage VDD and the gate of the third transistor M3, and may be turned on or off in response to the control signal POL.

The fourth switch sw4 may supply the first supply voltage VSS to the gate of the fourth transistor M4 or disconnect the first supply voltage VSS from the gate of the fourth transistor M4, based on the state of the control signal POL.

For example, the fourth switch sw4 may be connected between the first supply voltage VSS and the gate of the fourth transistor M4, and may be turned on or off in response to the control signal POL.

When one of the third and fourth switches sw3 and sw4 is turned on in response to the control signal POL, the other of the third and fourth switches sw3 and sw4 may be turned off. For example, the third and fourth switches sw3 and sw4 may be implemented with transistors of different conduction types.

The second controller, which is designated by reference numeral "350-1", may supply the first leakage cut-off control voltage to the body or bulk of the second transistor M2, and the second leakage cut-off control voltage to the body or bulk of the third transistor M3, based on the state of the control signal POL.

Here, the first leakage cut-off control voltage may be one of the first supply voltage VSS and second supply voltage HVDD, whereas the second leakage cut-off control voltage may be one of the second supply voltage HVDD and third supply voltage VDD.

The second controller 350-1 may include a plurality of switches sw9 to sw12.

The switches sw9 to sw12 may supply the first supply voltage VSS or second supply voltage HVDD to the body or bulk of the second transistor M2, and may supply the second supply voltage HVDD or third supply voltage VDD to the body or bulk of the third transistor M3, based on the state of the control signal POL.

For example, the switches sw9 and sw10 may supply the first supply voltage VSS or the second supply voltage HVDD to the body or bulk of the second transistor M2. When the switch sw9 is turned on based on the state of the control signal POL, the switch sw10 may be turned off. When the switch sw10 is turned on based on the state of the control signal POL, the switch sw9 may be turned off.

Similarly, the switches sw11 and sw12 may supply the second supply voltage HVDD or the third supply voltage VDD to the body or bulk of the third transistor M3. When the switch sw11 is turned on based on the state of the control signal POL, the switch sw12 may be turned off. When the switch sw12 is turned on based on the state of the control signal POL, the switch sw11 may be turned off.

In one embodiment, when the control signal POL has a high logic level, the third supply voltage VDD may be supplied to the body or bulk 101 of the third transistor M3 in accordance with switch sw11 being turned off and switch sw12 being turned on in the second controller 350-1. As such, the leakage current LC1 (FIG. 4A) may be reduced or prevented.

On the other hand, when the control signal POL has a low logic level, the first supply voltage VSS may be supplied to the body or bulk 101 of the second transistor M2 in accordance with the switch sw9 being turned on and the switch sw10 being turned off in the second controller 350-1. As such, leakage current LC2 (FIG. 4B) may be reduced or prevented.

Figure 6:
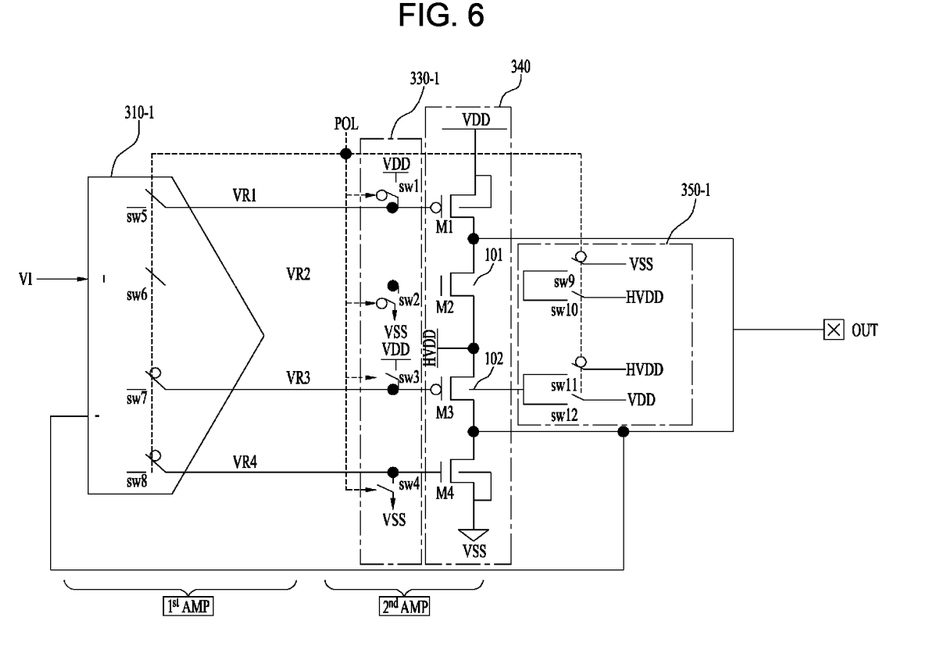
FIG. 6 is a circuit diagram illustrating another embodiment of the output buffer illustrated in FIG. 3.

FIG. 6 illustrates another embodiment of the output buffer in FIG. 3. In FIG. 6, constituent elements identical to those of FIGS. 3 and 5 will be designated by the same reference numerals, and description thereof will be briefly given or will be eliminated.

In the output buffer according to the embodiment of FIG. 6, the switching unit 320 illustrated in FIG. 5 may be included in the first amplifier 310.

Figure 7:
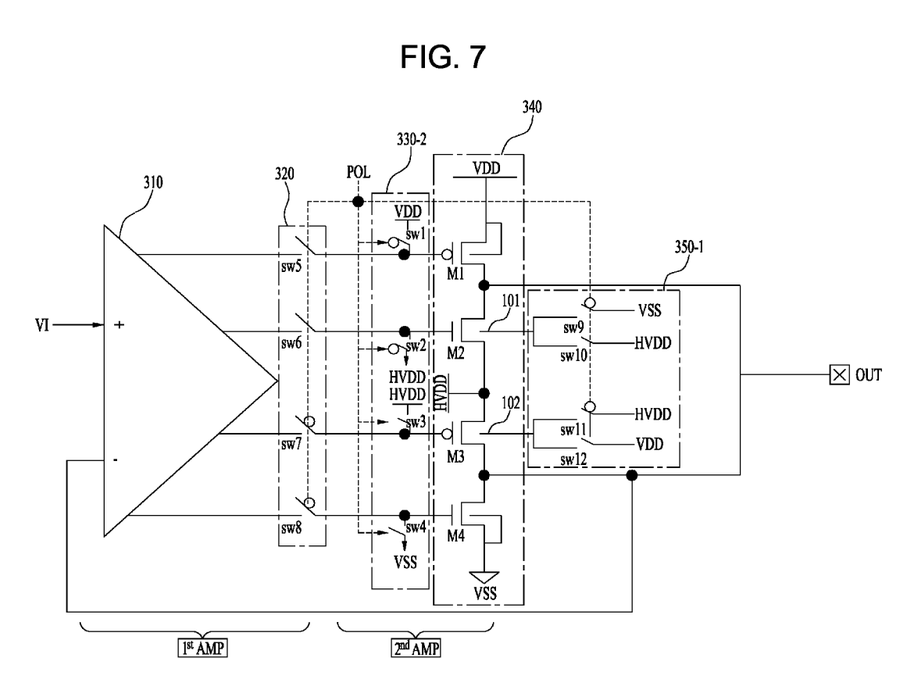
FIG. 7 is a circuit diagram illustrating another embodiment of the output buffer illustrated in FIG. 3.

FIG. 7 illustrates another embodiment of the output buffer in FIG. 3. In FIG. 7, constituent elements identical to those of FIGS. 3 and 5 will be designated by the same reference numerals, and description thereof will be briefly given or will be eliminated.

Referring to FIG. 7, the first controller, which is designated by reference numeral "330-2", may include a plurality of switches sw1 to sw4 for connecting the gates of the first to fourth transistors M1 to M4 to the second supply voltage HVDD or third supply voltage VDD.

The embodiment of FIG. 7 differs from the embodiment of FIG. 5 in that, although the first supply voltage VSS is used to control the gate of the second transistor M2 and the third supply voltage VDD is used to control the gate of the third transistor M3 in the embodiment of FIG. 5, the second supply voltage HVDD is used to control the gate of the second transistor M2 and the gate of the third transistor M3 in the embodiment of FIG. 7.

Figure 8:
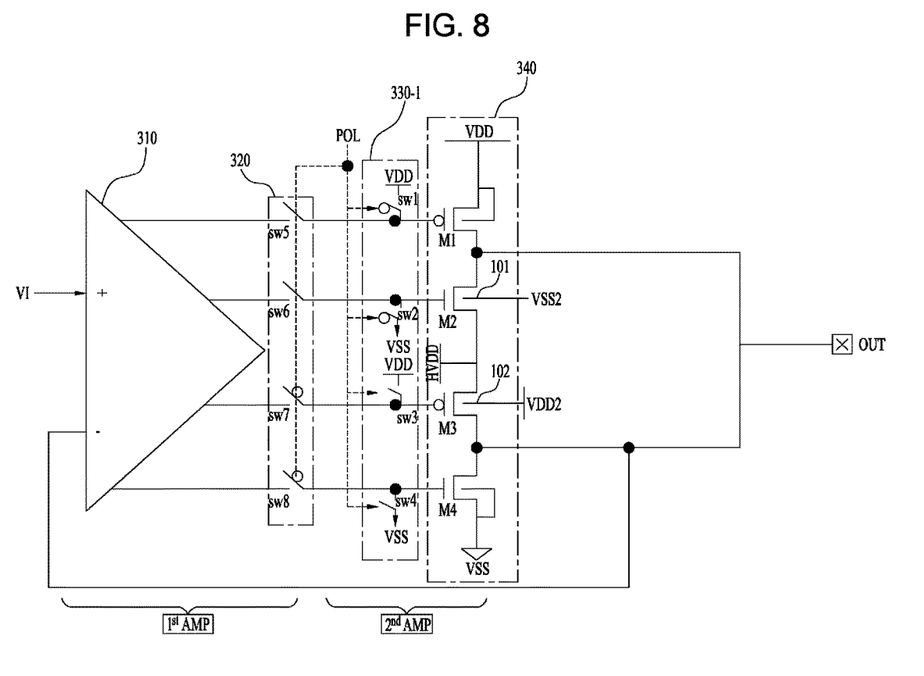
FIG. 8 is a circuit diagram illustrating another embodiment of the output buffer illustrated in FIG. 3.

FIG. 8 illustrates another embodiment of the output buffer in FIG. 3. In FIG. 8, constituent elements identical to those of FIGS. 3 and 5 will be designated by the same reference numerals, and description thereof will be briefly given or will be eliminated.

Referring to FIG. 8, the second controller 350 illustrated in FIG. 3 is eliminated. In the embodiment of FIG. 8, a leakage cut-off control voltage VSS2 may be supplied to the body or bulk 101 of the second transistor M2, and another leakage cut-off control voltage VDD2 may be supplied to the body or bulk 102 of the third transistor M3, irrespective or independently of the control signal POL. In this case, the leakage cut-off control voltage VSS2 may be identical to the leakage cut-off control voltage V11 (e.g., as in the embodiment of FIG. 3), and the leakage cut-off control voltage VDD2 may be identical to the leakage cut-off control voltage V12 (e.g., as in the embodiment of FIG. 3).

Since the output buffers according to the above-described embodiments have a structure that may eliminate a multiplexer that includes switches that are directly connected to the output node (e.g., output node OUT in FIGS. 3 and 5-8), it may be possible to reduce the delay of an output signal of the output buffer and heat generated by resistance components (e.g., parasitic resistances) of the multiplexer. In addition, since the output buffers according to the above-described embodiments have a structure that may eliminate a multiplexer that consumes a large area, it may be possible to reduce the size or area of the source driver in a chip according to the embodiments.

Figure 9:
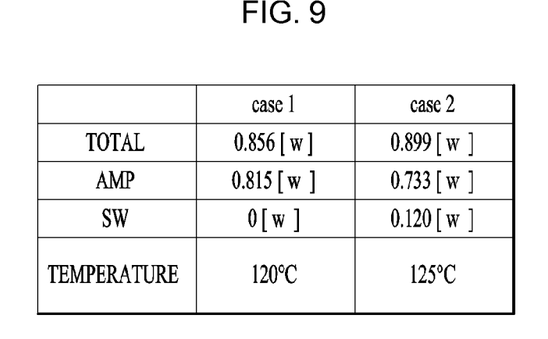
FIG. 9 is a table illustrating heat generation in an output buffer according to one or more embodiments of the invention.

FIG. 9 is a graph showing heat generation of an output buffer according to one or more embodiments of the invention. TOTAL in FIG. 9 means total power consumption. AMP in FIG. 9 means the total power consumption of the first and second amplifiers 310 and 340. SW in FIG. 9 means the total power consumption of the switches in the multiplexer of the conventional output buffer.

Case 1 shows heat generation of an output buffer according to an embodiment of the present invention, having a structure from which a multiplexer directly connected to the output node OUT (see, e.g., FIGS. 3 and 5-8) is eliminated. Case 2 illustrates heat generation of an output buffer similar to those shown in FIGS. 3 and 5-8, but having a multiplexer directly connected to the output node OUT.

Referring to FIG. 9, it may be seen that the temperature in case 1 is 120° C., and the temperature generated in case 2 is 125° C. The temperature in case 1 is lower than the temperature in case 2 by 5° C.

Figure 10:
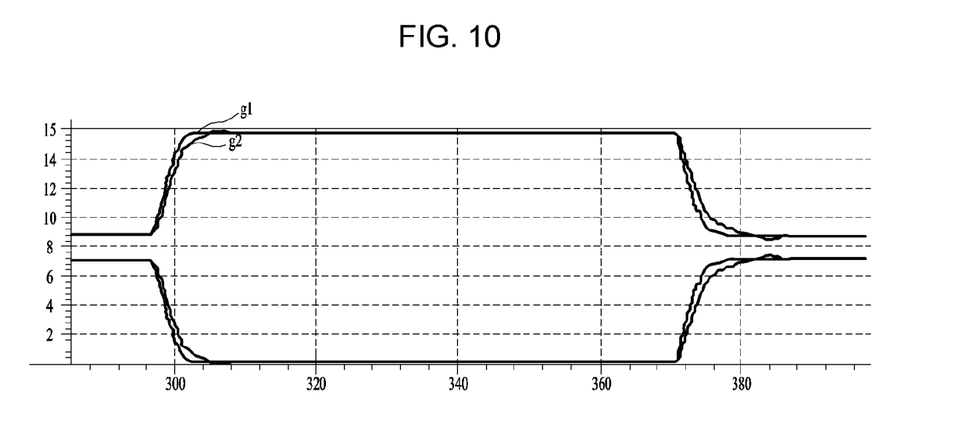
FIG. 10 is a diagram illustrating one or more waveforms of signals in an output buffer according to one or more embodiments of the invention.

FIG. 10 illustrates a waveform of an output buffer according to one or more embodiments of the invention.

The waveform "g1" represents a waveform of an output signal from an output buffer according to an embodiment of the invention, from which a multiplexer directly connected to the output node OUT is eliminated. The waveform "g2" represents a waveform of an output signal from an output buffer having a multiplexer directly connected to the output node OUT. The abscissa ("x-axis") may represent time, and the ordinate ("y-axis") may represent voltage.

Referring to FIG. 10, when the waveform of the output signal is positive or rising, the slew rate of g1 is 440 ps, and the slew rate of g2 is 610 ps and, as such, the slew rate of g1 is faster than the slew rate of g2 by 170 ps.

Figure 11:
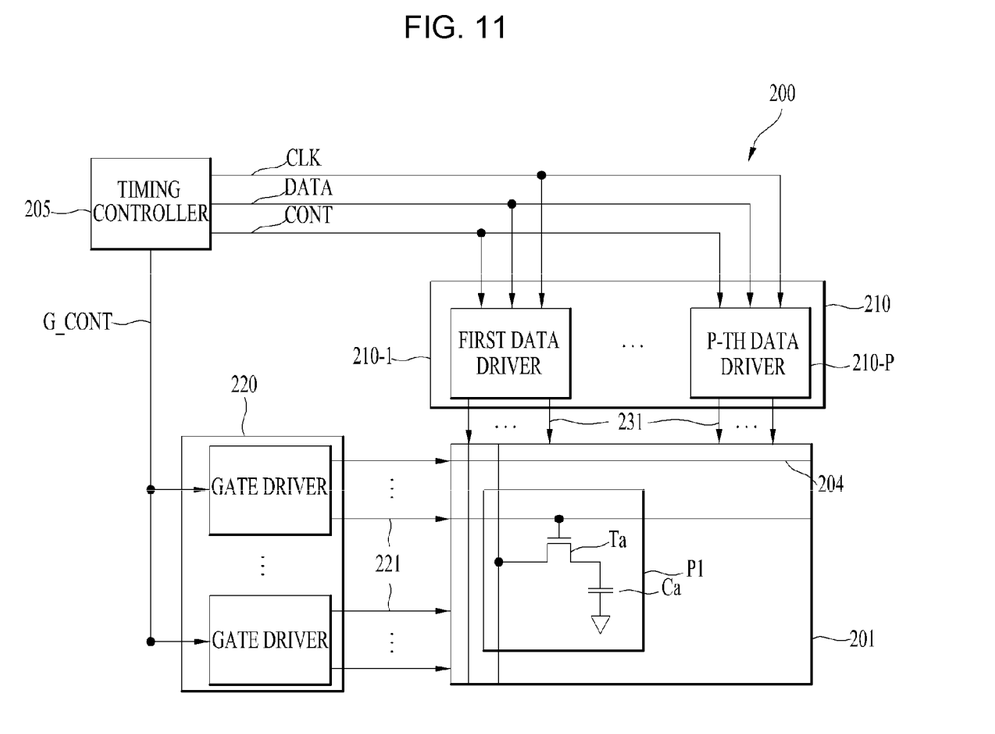
FIG. 11 is a block diagram illustrating an exemplary display device including a source driver according to one or more embodiments of the invention.

FIG. 11 illustrates a display device 200 including a source driver according to embodiments of the invention.

Referring to FIG. 11, the display device 200 includes a display panel 201, a timing controller 205, a source driver unit 210, and a gate driver unit 220.

The display panel 201 may include gate lines 221 in rows and source lines 231 in columns. The gate lines 221 and source lines 231 intersect each other to form a matrix. The display panel 201 may also include pixels (for example, P1), each connected to one of the gate lines 221 and one of the source lines 231 at an intersection thereof. The display panel 201 thus may include a plurality of pixels P1. Each pixel P1 may include a transistor Ta and a capacitor Ca.

The timing controller 205 outputs a clock signal CLK, one or more data signals DATA, one or more data control signals CONT to control the source driver unit 210, and a gate control signal G_CONT to control the gate driver unit 220.

For example, the data control signals CONT may include a horizontal start signal and an enable signal En (which together with the clock signal CLK are input to the shift registers [e.g., shift register 110 in FIG. 1] of the source driver unit 210), a horizontal line signal, a frame signal, and the inversion polarity signal POL.

The gate driver unit 220 drives the gate lines 221, and may include a plurality of gate drivers (e.g., one driver for each group of m lines, where m=n/p, n is the number of gate lines or rows in the matrix, and p [which is an integer>2] is the number of gate drivers). The gate driver unit 220 may output a gate control signal to the gate lines 221, to turn on or off the transistors Ta of the pixels P1.

The source driver unit 210 drives the source lines 231, and may include a plurality of source drivers 210-1 to 210-P (P being a natural number equal to or greater than 1). Each of the source drivers 210-1 to 210-P (P being a natural number equal to or greater than 1) may comprise the source driver 100 in FIG. 1.

As is apparent from the above description, embodiments of the source drivers 210-1 to 210-P may reduce delay of an output signal and heat generation.

The embodiments as described above may include particular features, structures, or characteristics, but not every embodiment necessarily includes the particular features, structures, or characteristics. Furthermore, the particular features, structures or characteristics in each embodiment may be combined in any suitable manner, as would be apparent to one of ordinary skill in the art from this disclosure, in one or more embodiments. Therefore, combinations of features of different embodiments are meant to be within the scope of the invention.

What is claimed is:

1. An output buffer comprising:
a first amplifier configured to amplify an input signal and output first to fourth amplified signals;
a first transistor comprising a first drain, a first gate configured to receive the first amplified signal, and a first source;
a second transistor comprising a second drain directly connected to the first drain at a first node, a second gate configured to receive the second amplified signal, and a second source;
a third transistor comprising a third drain, a third gate configured to receive the third amplified signal, and a third source directly connected to the second source;
a fourth transistor comprising a fourth drain directly connected to the third drain at a second node, a fourth gate configured to receive the fourth amplified signal, and a fourth source;
an output node directly connected to the first and second nodes; and
a first controller configured to selectively supply a control voltage to the first to fourth gates in response to a control signal.

2. The output buffer according to claim 1, wherein a first supply voltage is supplied to the fourth source, a second supply voltage higher than the first supply voltage is supplied to the second source and the third source, and a third supply voltage higher than the second supply voltage is supplied to the first source.

3. The output buffer according to claim 1, wherein the first and third transistors have a first conduction type, the second and fourth transistors have a second conduction type, and the first conduction type is opposite or complementary to the second conduction type.

4. The output buffer according to claim 1, wherein the first controller disconnects the control voltage to the third and fourth gates when the control voltage is supplied to the first and second gates.

5. The output buffer according to claim 4, wherein:
the control voltage comprises a first supply voltage and a third supply voltage higher than the first supply voltage; and
the first controller supplies one of the first and third supply voltages to one of the first and second gates or one of the third and fourth gates, and supplies the other of the first and third supply voltages to the other of the first and second gates and/or the other of the third and fourth gates.

6. The output buffer according to claim 1, wherein the first controller is configured to supply the control voltage to the first and second gates and disconnect the control voltage from the third and fourth gates, or supply the control voltage to the third and fourth gates and disconnect the control voltage from the first and second gates.

7. The output buffer according to claim 6, wherein the first controller comprises first and second switches having a first conduction type, and third and fourth switches having a second conduction type, the first conduction type being opposite or complementary to the second conduction type.

8. The output buffer according to claim 1, further comprising:
a switching unit configured to supply the amplified signals to the first to fourth gates or disconnect the amplified signals from the first to fourth gates in response to the control signal.

9. The output buffer according to claim 8, wherein the switching unit is configured to supply the amplified signals to the first and second gates and disconnect the amplified signals from the third and fourth gates when the control signal has a first logic level, and supply the amplified signals to the third and fourth gates and disconnect the amplified signals from the first and second gates when the control signal has a second logic level.

10. The output buffer according to claim 9, wherein the switching unit comprises fifth and sixth switches having a second conduction type, and seventh and eighth switches having a first conduction type, the second conduction type being opposite or complementary to the first conduction type.

11. The output buffer according to claim 1, wherein the first amplifier supplies the amplified signals to the first to fourth gates or disconnects the amplified signals from the first to fourth gates in response to the control signal.

12. The output buffer according to claim 2, further comprising:
a second controller configured to directly supply a first leakage cut-off control voltage to a body or bulk of the second transistor and a second leakage cut-off control voltage to a body or bulk of the third transistor.

13. The output buffer according to claim 12, wherein the first leakage cut-off control voltage is directly supplied to the body or bulk of the second transistor, or the second leakage cut-off control voltage is supplied to the body or bulk of the third transistor, in response to the control signal.

14. The output buffer according to claim 13, wherein the first leakage cut-off control voltage is higher than the third supply voltage, and the second leakage cut-off control voltage is lower than the first supply voltage.

15. The output buffer according to claim 13, wherein the first leakage cut-off control voltage is one of the first and second supply voltages, and the second leakage cut-off control voltage is one of the second and third supply voltages.

16. The output buffer according to claim 2, wherein a first leakage cut-off control voltage lower than the first supply voltage is directly supplied to a body or bulk of the second transistor, and a second leakage cut-off control voltage higher than the third supply voltage is directly supplied to a body or bulk of the third transistor.

17. The output buffer according to claim 1, wherein the first amplifier comprises a rail-to-rail amplifier.

18. A source driver comprising:
a latch unit configured to store data;
a level shifter configured to shift a voltage level of the data from the latch unit;
a digital-to-analog converter configured to convert an output from the level shifter to an analog signal; and
the output buffer of claim 1, configured to amplify the analog signal, and output the amplified signal.

19. A display device comprising:
a display panel comprising gate lines in rows and source lines in intersecting columns to form a matrix, and pixels each connected to one of the gate lines and one of the source lines at an intersection thereof;
a plurality of the source drivers of claim 18, configured to drive the source lines; and
a timing controller configured to supply a control signal to each of the source drivers.

* * * * *